(12) United States Patent
Nakagawa

(10) Patent No.: US 8,414,705 B2
(45) Date of Patent: Apr. 9, 2013

(54) SEAL MECHANISM, SEAL TRENCH, SEAL MEMBER, AND SUBSTRATE PROCESSING APPARATUS

(75) Inventor: Yusuke Nakagawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1114 days.

(21) Appl. No.: 12/357,689

(22) Filed: Jan. 22, 2009

(65) Prior Publication Data

US 2009/0183832 A1 Jul. 23, 2009

Related U.S. Application Data

(60) Provisional application No. 61/033,287, filed on Mar. 3, 2008.

(30) Foreign Application Priority Data

Jan. 22, 2008 (JP) ................................. 2008-011601

(51) Int. Cl.
*C23C 16/00* (2006.01)
*F16J 15/00* (2006.01)
*F16J 15/02* (2006.01)
*F16J 15/06* (2006.01)
*F16J 15/10* (2006.01)

(52) U.S. Cl. ........ 118/733; 118/715; 277/590; 277/628; 277/637; 277/641; 277/642; 277/644; 277/650

(58) Field of Classification Search .................. 118/715, 118/733; 277/312, 650, 590, 628, 637, 641, 277/642, 644
See application file for complete search history.

(56) References Cited

U.S. PATENT DOCUMENTS

| | | | | | |
|---|---|---|---|---|---|
| 2,438,153 | A | * | 3/1948 | Burns | 92/250 |
| 3,744,008 | A | * | 7/1973 | Castellani | 248/56 |
| 5,223,001 | A | * | 6/1993 | Saeki | 29/25.01 |
| 5,368,648 | A | * | 11/1994 | Sekizuka | 118/733 |
| 5,578,132 | A | * | 11/1996 | Yamaga et al. | 118/724 |
| 5,632,820 | A | * | 5/1997 | Taniyama et al. | 118/724 |
| 5,653,447 | A | * | 8/1997 | Cress | 277/312 |
| 5,676,757 | A | * | 10/1997 | Ikeda et al. | 118/733 |
| 5,921,559 | A | * | 7/1999 | Aihara | 277/651 |

(Continued)

FOREIGN PATENT DOCUMENTS

GB 2008162 A * 5/1979
JP 2006-342386 12/2006

*Primary Examiner* — Jeffrie R Lund
(74) *Attorney, Agent, or Firm* — Oblon, Spivak, McClelland, Maier & Neustadt, L.L.P.

(57) ABSTRACT

A seal mechanism that can prevent the occurrence of corrosion and abnormal discharge. The seal mechanism is disposed between first and second structural members having opposing surfaces. A first seal trench and a second seal trench are formed respectively in a first opposing surface of the first structural member and in a second opposing surface of the second structural member. A first seal member and a second seal member are housed respectively in the first and second seal trenches. The first seal member and the second seal member are brought into pressure contact with each other. These seal trenches have a first seal surface and a second seal surface from which aluminum is exposed, and further have first shut-off surface disposed between the first opposing surface and the first seal surface and a second shut-off surface disposed between the second opposing surface and the second seal surface. The first seal member has a first covering portion that covers the first shut-off surface, and the second seal member has a second covering portion that covers the second shut-off surface.

7 Claims, 6 Drawing Sheets

U.S. PATENT DOCUMENTS

| | | | |
|---|---|---|---|
| 6,033,478 A * | 3/2000 | Kholodenko | 118/500 |
| 6,074,519 A * | 6/2000 | Lee et al. | 156/345.47 |
| 6,245,149 B1 * | 6/2001 | de Lomenie et al. | 118/719 |
| 6,772,827 B2 * | 8/2004 | Keller et al. | 165/53 |
| 7,651,568 B2 * | 1/2010 | Ishizaka et al. | 118/715 |
| 8,016,549 B2 * | 9/2011 | Shah et al. | 415/134 |
| 2004/0017049 A1 * | 1/2004 | Fink | 277/627 |
| 2005/0183824 A1 * | 8/2005 | Lee et al. | 156/345.31 |
| 2005/0253341 A1 * | 11/2005 | Shojima | 277/584 |
| 2006/0213437 A1 * | 9/2006 | Ishizaka et al. | 118/715 |
| 2006/0213438 A1 * | 9/2006 | Ishizaka et al. | 118/715 |
| 2007/0075503 A1 * | 4/2007 | Hayashi et al. | 277/589 |
| 2007/0209588 A1 * | 9/2007 | Li | 118/715 |
| 2007/0212484 A1 * | 9/2007 | Li | 427/248.1 |
| 2008/0088097 A1 | 4/2008 | Tanaka | |
| 2009/0183832 A1 * | 7/2009 | Nakagawa | 156/345.1 |
| 2009/0205676 A1 * | 8/2009 | Nakagawa | 134/1 |
| 2009/0206558 A1 * | 8/2009 | Nameki | 277/644 |
| 2011/0169229 A1 * | 7/2011 | Hamade et al. | 277/650 |
| 2012/0267864 A1 * | 10/2012 | Watanabe et al. | 277/648 |

* cited by examiner

SEAL MECHANISM, SEAL TRENCH, SEAL MEMBER, AND SUBSTRATE PROCESSING APPARATUS

BACKGROUND OF THE INVENTION

1. Field of the Invention

The present invention relates to a seal mechanism, a seal trench, a seal member, and a substrate processing apparatus, and in particular to a seal mechanism of a substrate processing apparatus that generates plasma in a processing chamber, of which interior is in a vacuum and inner wall is maintained at high temperature, and carries out processing on substrates using the plasma.

2. Description of the Related Art

A substrate processing apparatus that carries out plasma processing such as etching processing on semiconductor wafers (hereinafter referred to as "wafers") as substrates is comprised of a processing chamber (hereinafter referred to as the "chamber") that accommodates a wafer and of which interior can be evacuated. The chamber is made of aluminum, and substantially the entire inner wall of the chamber is covered with alumite. In this substrate processing apparatus, a process gas supplied into the chamber is turned into plasma, and etching processing is carried out on a wafer by the plasma. Also, the substrate processing apparatus has a seal mechanism that seals the interior of the chamber from outside (see, for example, Japanese Laid-Open Patent Publication (Kokai) No. 2006-342386).

In recent years, to increase the packing density of a semiconductor device formed on a wafer, there has been developed a semiconductor device having a multilayer structure. In a process of manufacturing such a semiconductor device having a multilayer structure, etching processing is repeatedly carried out on wafers in the same chamber from the viewpoint of increasing throughput. If the etching processing is repeatedly carried out, then deposit will become attached to surfaces of an inner wall and component parts (hereinafter referred to as "the inner wall, etc. of the chamber"). To suppress the attachment of the deposit, a substrate processing apparatus has a heating mechanism that heats the inner wall, etc. of the chamber so that the temperature of the inner wall, etc. of the chamber can increase to vaporize a reaction product and a process gas that has reached the surfaces of the inner wall, etc. of the chamber so as to suppress the attachment of the deposit.

A seal mechanism which the substrate processing apparatus has is disposed, for example, between a side wall of the chamber and an upper lid of the chamber so as to seal the interior of the chamber from outside. This seal mechanism is usually comprised of a seal member formed of an O-ring, and a seal surface that is in contact with an O-ring covered with alumite. Because the inner wall, etc. of the chamber is heated by the heating mechanism as described above, the temperature of the seal mechanism as well as the inner wall, etc. of the chamber increases. In general, the heat resistance of the alumite is low, and hence the alumite of the seal surface becomes cracked when the temperature of the seal mechanism increases. When cracking occurs, it becomes difficult to seal the interior of the chamber with the O-ring and the seal surface, and as a result, the amount of air leakage into the chamber increases.

Accordingly, to cope with the problem of the increase in the amount of air leakage caused by the increase in the temperature of the seal mechanism, there has been proposed that the alumite is removed from the seal surface to expose aluminum that does not become cracked by heat, and the seal surface of the aluminum and the O-ring are brought into contact with each other. Whereby, even if the temperature increases, sealing by the O-ring and the seal surface can be maintained, and as a result, the amount of air leakage into the chamber can be prevented from increasing.

However, if the aluminum is exposed from the seal surface, the seal surface of the aluminum corrodes due to moisture attracted to the seal surface cause by air release at the time of maintenance and a solution produced by reaction of a process gas supplied into the chamber and reaction product. The corrosion of the seal surface of the aluminum will impair the shape and strength thereof, and hence the occurrence of the corrosion has to be prevented.

Moreover, in the substrate processing apparatus, electric charges are accumulated on the alumite on the inner wall, etc. of the chamber each time etching processing is carried out, but if a seal surface from which aluminum is exposed exists in the vicinity of the inner wall, etc. of the chamber, abnormal discharge (arcing) toward the seal surface caused by the accumulated electric charges will occur when the alumite on which the electric charges are accumulated break. Because the abnormal discharge may produce particles or damage the O-ring, the abnormal discharge has to be prevented.

SUMMARY OF THE INVENTION

The present invention provides a seal mechanism, a seal trench, a seal member, and a substrate processing apparatus that can prevent the occurrence of corrosion and abnormal discharge.

Accordingly, in a first aspect of the present invention, there is provided a seal mechanism that is disposed between first and second structural members having opposing surfaces, comprising a first seal trench that is formed in a first opposing surface of the first structural member, a first seal member that is housed in the first seal trench, and part of which projects from the first opposing surface, a second seal trench that is formed in a second opposing surface of the second structural member, and a second seal member that is housed in the second seal trench, and part of which projects from the second opposing surface, wherein the first seal member and the second seal member are brought into pressure contact with each other, the first seal trench comprises a first seal surface from which aluminum is exposed and with which the first seal member is brought into pressure contact, and a first shut-off surface that is disposed between the first opposing surface and the first seal surface, the first seal member comprises a first covering portion that covers the first shut-off surface when the first seal member is housed in the first seal trench, the second seal trench comprises a second seal surface from which aluminum is exposed and with which the second seal member is brought into pressure contact, and a second shut-off surface that is disposed between the second opposing surface and the second seal surface, and the second seal member comprises a second covering portion that covers the second shut-off surface when the second seal member is housed in the second seal trench.

According to the first aspect of the present invention, the first seal member is brought into pressure contact with the first seal surface from which aluminum is exposed, the second seal member is brought into pressure contact with the second seal surface from which aluminum is exposed, the first covering portion of the first seal member covers the first shut-off surface disposed between the first seal surface and the first opposing surface, and the second covering portion of the second seal member covers the second shut-off surface disposed between the second seal surface and the second opposing surface, whereby the first seal surface is shut off from the outside of the first seal trench, and the second seal surface is shut off from the outside of the second seal trench. As a result, a process gas supplied to the outside of the first and second seal trenches and reaction product can be prevented from reaching the first and second seal surfaces. Further, the surface of the first seal trench from which aluminum is exposed is shut off from alumite in the vicinity of the seal mechanism, and the surface of the second seal trench from which aluminum is exposed is shut off from alumite in the vicinity of the seal mechanism. As a result, even if alumite with accumulated charges break (insulation breakdown), abnormal discharge (arcing) toward the exposed aluminum, which is caused by the charges accumulated in the alumite, does not occur. Therefore, the occurrence of corrosion and abnormal discharge can be prevented.

The first aspect of the present invention can provide a seal mechanism, wherein the first seal member and the second seal member are made of fluorine rubber.

According to the first aspect of the present invention, the first seal member and the second seal member are made of fluorine rubber. The fluorine rubber is equal in dielectric strength to alumite, and the thickness of the first seal member and the second seal member is thicker than an alumite film. Thus, the dielectric strength of the first and second seal members is higher than that of an alumite film, the surfaces of the first and second seal trenches can be satisfactorily protected.

The first aspect of the present invention can provide a seal mechanism, wherein the fluorine rubber is FKM or FFKM.

According to the first aspect of the present invention, the fluorine rubber is FKM or FFKM. Because FKM and FFKM have high dielectric strength, the dielectric strength of the first seal member and the second seal member can be reliably made higher than that of the alumite film.

The first aspect of the present invention can provide a seal mechanism, wherein the first shut-off surface and the second shut-off surface comprise tapered surfaces.

According to the first aspect of the present invention, because the first shut-off surface and the second shut-off surface are comprised of the tapered surfaces, the first seal trench and the second seal trench can be formed with ease.

The first aspect of the present invention can provide a seal mechanism, wherein the first seal trench comprises a first holding portion that holds the housed first seal member, and the second seal trench comprises a second holding portion that holds the housed second seal member.

According to the first aspect of the present invention, the first seal member is held in THE first holding portion, and the second seal member is held in the second holding portion. This prevents the first seal member and the second seal member from falling off.

The first aspect of the present invention can provide a seal mechanism, wherein a surface of the second seal member which is brought into pressure contact with the first seal member is shaped as a curved surface.

According to the first aspect of the present invention, because the surface of the second seal member which is brought into pressure contact with the first seal member is shaped as a curved surface, a high contact pressure can be maintained by bringing the first seal member and the second seal member into partial contact with each other, and hence the sealing characteristics of the seal mechanism can be improved.

Accordingly, in a second aspect of the present invention, there is provided a seal mechanism that is disposed between first and second structural members having opposing surfaces, comprising a seal trench that is formed in a first opposing surface of the first structural member, and a seal member that is housed in the seal trench, and part of which projects from the first opposing surface, wherein the seal member and the second opposing surface of the second structural member are brought into pressure contact with each other, the seal trench comprises a seal surface from which aluminum is exposed and with which the seal member is brought into pressure contact, and a shut-off surface that is disposed between the first opposing surface and the seal surface, the seal member comprises a covering portion that covers the shut-off surface when the seal member is housed in the seal trench.

According to the second aspect of the present invention, because the seal member is brought into pressure contact with the seal surface from which aluminum is exposed, the seal member is brought into pressure contact with the second opposing surface of the second structural member, and the shut-off surface disposed between the seal surface and the first opposing surface is covered by the covering portion, the same effects as those obtained by the above described seal mechanism can be obtained. Further, because one seal trench, one seal member, and the seal surface made of ceramic constitute the seal mechanism, the construction of the seal mechanism can be simplified as compared with the above described seal mechanism.

The second aspect of the present invention can provide a seal mechanism, wherein the second opposing surface is made of a material with high heat resistance, high dielectric strength, and high corrosion resistance.

According to the second aspect of the present invention, because the second opposing surface is made of a material with high heat resistance, high dielectric strength, and high corrosion resistance, the second opposing surface can be reliably made to function as a seal surface.

Accordingly, in a third aspect of the present invention, there is provided a seal trench that is formed in a predetermined surface of a structural member and houses a seal member, comprising a seal surface from which aluminum is exposed and with which the seal member is brought into pressure contact, and a shut-off surface that is disposed between the predetermined surface and the seal surface, wherein the shut-off surface is covered with a covering portion of the seal member when the seal member is housed in the seal trench.

According to the third aspect of the present invention, because the seal member is brought into pressure contact with the seal surface from which aluminum is exposed, and the covering portion of the seal member covers the shut-off surface disposed between the seal surface and the predetermined surface, the same effects as those obtained by the above described seal mechanism can be obtained.

The third aspect of the present invention can provide a seal trench comprising a holding portion that holds the housed seal member.

According to the third aspect of the present invention, because the seal member is held in the holding portion. This prevents the seal member from falling off.

Accordingly, in a fourth aspect of the present invention, there is provided a seal member that is housed in a seal trench formed in a predetermined surface of a structural member, comprising a covering portion, wherein, when the seal member is housed in the seal trench, the seal member is brought into pressure contact with a seal surface which the seal trench has and from which aluminum is exposed, and the covering portion covers a shut-off surface which the seal trench has and that is disposed between the predetermined surface and the seal surface.

According to the fourth aspect of the present invention, because the seal member is brought into pressure contact with the seal surface of the seal trench from which aluminum is exposed, and the covering portion of the seal member covers the shut-off surface disposed between the seal surface and the predetermined surface, the same effects as those obtained by the above described seal mechanism can be obtained.

Accordingly, in a fifth aspect of the present invention, there is provided a substrate processing apparatus including a seal mechanism as described above.

Accordingly, in a sixth aspect of the present invention, there is provided a substrate processing apparatus including a seal trench as described above.

Accordingly, in a seventh aspect of the present invention, there is provided a substrate processing apparatus including a seal member as described above.

The features and advantages of the invention will become more apparent from the following detailed description taken in conjunction with the accompanying drawings.

BRIEF DESCRIPTION OF THE DRAWINGS

FIGS. 4A and 4B are cross-sectional views schematically showing variations of the construction of the seal mechanism, in which FIG. 4A shows the case where a side face of a housing trench is covering with an alumite film, and FIG. 4B shows the case where a tapered surface is provided in place of the housing trench;

FIGS. 5A and 5B are cross-sectional views schematically showing variations of the construction of the seal mechanism, in which FIG. 5A shows the case where there is provided a square trench in place of a holding trench, and FIG. 5B shows the case where there is provided only a housing trench.

DETAILED DESCRIPTION OF THE PREFERRED EMBODIMENTS

Preferred embodiments of the present invention will be described in detail below with reference to the drawings.

First, a substrate processing apparatus having a seal mechanism according to a first embodiment of the present invention will be described.

Figure 1:
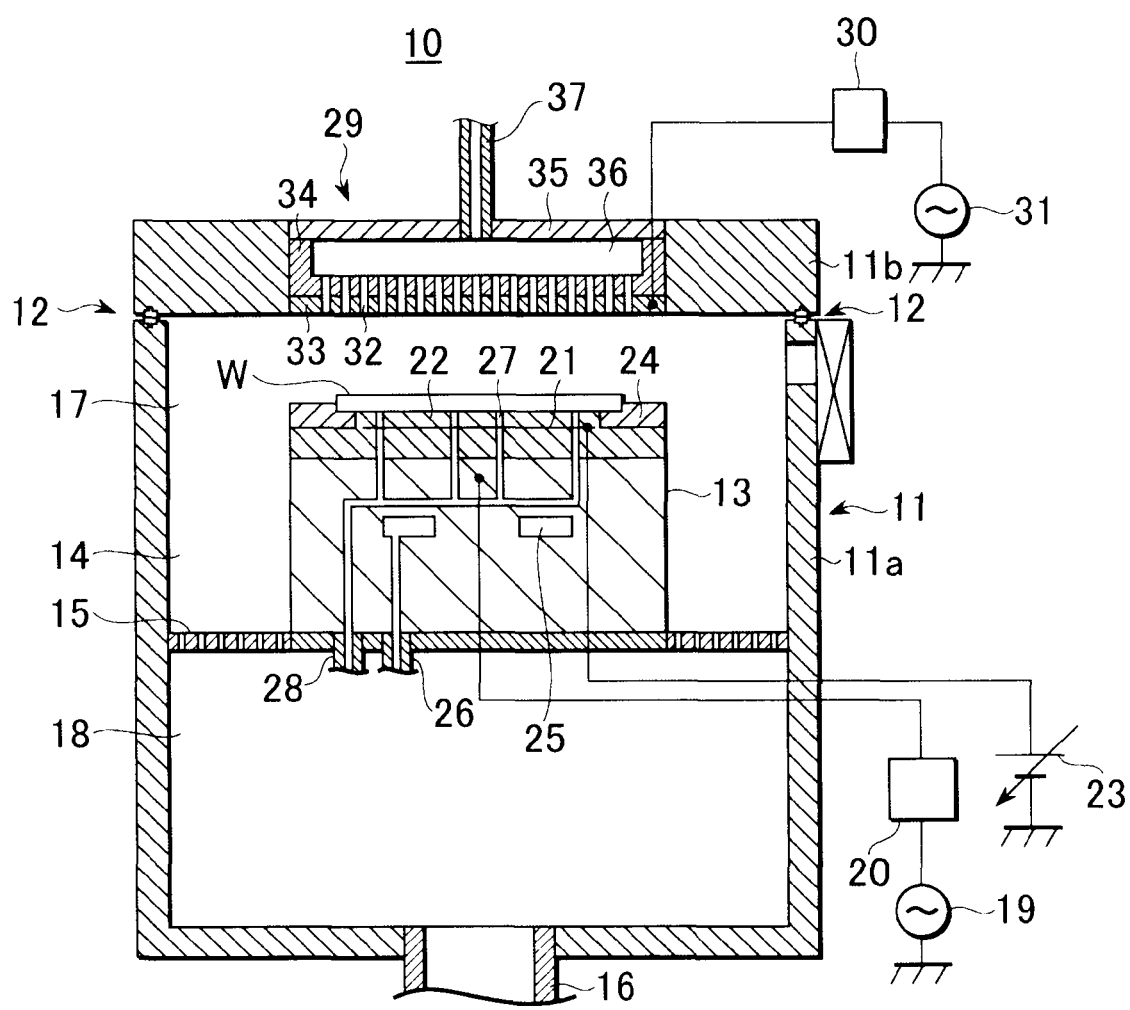
FIG. 1 is a cross-sectional view schematically showing the construction of a substrate processing apparatus that has a seal mechanism according to a first embodiment of the present invention.

FIG. 1 is a cross-sectional view schematically showing the construction of a substrate processing apparatus that has a seal mechanism according to the present embodiment. This substrate processing apparatus is constructed such as to carry out etching processing on semiconductor wafers as substrates.

Referring to FIG. 1, the substrate processing apparatus 10 has a chamber 11 that accommodates a semiconductor wafer (hereinafter simply referred to as "wafer") W having a diameter of e.g. 300 mm. Substantially the entire inner wall of the chamber 11 is covered with alumite. The chamber 11 has a cylindrical-shaped side wall 11a and a disc-shaped upper lid 11b, and a seal mechanism 12 that seals the interior of the chamber 11 from outside (atmosphere) is disposed between the side wall 11a and the upper lid 11b. A cylindrical susceptor 13 on which a wafer W is mounted is disposed in the chamber 11. In the substrate processing apparatus 10, the inner side wall of the chamber 11 and a side surface of the susceptor 13 form a side exhaust passage 14 functioning as a flow path for discharging gas above the susceptor 13 out of the chamber 11. An exhaust plate 15 is disposed in an intermediate portion of the side exhaust passage 14.

The exhaust plate 15 is a plate member formed with numerous holes, and functions as a partition plate for dividing the interior of the chamber 11 into an upper part and a lower part. Plasma is generated in the upper one part (hereinafter referred to as "the reaction chamber") 17 of the parts into which the chamber 11 is partitioned by the exhaust plate 15. An evacuation pipe 16 that discharges gas in the chamber 11 is connected to the lower part (hereinafter referred to as "the evacuation chamber (manifold)") 18 of the chamber 11. The exhaust plate 15 catches or reflects plasma generated in the reaction chamber 17 to thereby prevent leakage of the plasma into the manifold 18.

A TMP (Turbo Molecular Pump), not shown, and a DP (Dry Pump), not shown, are connected to the evacuation pipe 16, and these pumps reduce the pressure in the chamber 11 by evacuation. More specifically, the DP decompresses the interior of the chamber 11 from atmospheric pressure to an intermediate vacuum state (e.g. $1.3 \times 10$ Pa (0.1 Torr) or lower), while the TMP is cooperatively used with the DP to decompress the interior of the chamber 11 to a high vacuum state (e.g. $1.3 \times 10^{-3}$ Pa ($1.0 \times 10^{-5}$ Torr) or lower) lower than the intermediate vacuum state. It should be noted that the pressure in the chamber 11 is controlled by an APC valve, not shown.

A lower high-frequency power supply 19 is connected to the susceptor 13 in the chamber 11 via a lower matcher 20, and the lower high-frequency power supply 19 supplies predetermined high-frequency electrical power to the susceptor 13. Thus, the susceptor 13 functions as a lower electrode. The lower matcher 20 reduces reflection of the high-frequency electrical power from the susceptor 13 so as to maximize the efficiency of the supply of the high-frequency electrical power into the susceptor 13.

Disposed above the susceptor 13 is an electrostatic chuck 22 having an electrostatic electrode plate 21 therein. The electrostatic chuck 22 is formed by placing an upper disc-shaped member, which has a smaller diameter than a lower disc-shaped member having a certain diameter, over the lower disc-shaped member. It should be noted that the electrostatic chuck 22 is made of ceramic. When the wafer W is placed on the susceptor 13, the wafer W is disposed on the upper disc-shaped member of the electrostatic chuck 22.

A DC power supply 23 is electrically connected to the electrostatic electrode plate 21 of the electrostatic chuck 22. When a positive DC voltage is applied to the electrostatic electrode plate 21, a negative potential is generated on a surface (hereinafter referred to as "the rear surface") of the wafer W on the electrostatic chuck 22 side thereof, and therefore a potential difference is created between the electrostatic electrode plate 21 and the rear surface of the wafer W. As a result, the wafer W is held on the upper disk-shaped member of the electrostatic chuck 22 by attraction by a Coulomb force or a Johnsen-Rahbek force generated by the potential difference.

Further, an annular focus ring 24 is mounted on the electrostatic chuck 22 in a manner enclosing the attractedly held wafer W. The focus ring 24, which is formed of a conductive member, e.g. a silicon member, converges plasma in the reaction chamber 17 toward a front surface of the wafer W to thereby enhance the efficiency of plasma etching.

Inside the susceptor 13 is formed an annular coolant chamber 25 extending e.g. along the circumference of the susceptor 13. A coolant, such as cooling water or a Galden (registered trademark) fluid, at a low temperature is supplied to the coolant chamber 25 for circulation through a cooling pipe 26 from a chiller unit, not shown. The susceptor 13 cooled by the low-temperature coolant cools the wafer W and the focus ring 24 via the electrostatic chuck 22.

A plurality of heat transfer gas supply holes 27 are opened in a part (hereinafter referred to as the "holding surface") of the upper surface of the upper disk-shaped member of the electrostatic chuck 22 where the wafer W is held by attraction. These heat transfer gas supply holes 27 are connected to a heat transfer gas supply unit, not shown, via a heat transfer gas supply line 28, and the heat transfer gas supply unit supplies helium (He) gas as a heat transfer gas via the heat transfer gas supply holes 27 into a gap between the holding surface and the rear surface of the wafer W. The helium gas supplied into the gap between the holding surface and the rear surface of the wafer W effectively transfers heat of the wafer W to the electrostatic chuck 22.

A showerhead 29 is disposed in a ceiling of the chamber 11 in a manner opposed to the susceptor 13. An upper radio-frequency power supply 31 is connected to the showerhead 29 via an upper matcher 30, and the upper radio-frequency power supply 31 supplies predetermined radio-frequency power to the shower head 29. Thus, the showerhead 29 functions as an upper electrode. It should be noted that the upper matcher 30 has a function similar to the function of the lower matcher 20 described above.

The showerhead 29 has a ceiling electrode plate 33 having therein a number of gas holes 32, a cooling plate 34 that detachably suspends the ceiling electrode plate 33, and a cover member 35 that covers the cooling plate 34. A buffer chamber 36 is provided inside the cooling plate 34, and a process gas-introducing pipe 37 is connected to the buffer chamber 36. The showerhead 29 supplies a process gas supplied to the buffer chamber 36 through the process gas-introducing pipe 37 to the reaction chamber 17 through the gas holes 32.

Moreover, the substrate processing apparatus 10 has a heating mechanism, not shown, in the chamber 11 that heats, for example, an inner wall of the chamber 11.

In the substrate processing apparatus 10, high-frequency electrical power is supplied to the susceptor 13 and the showerhead 29 to apply high-frequency electrical power to the interior of the reaction chamber 17, whereby the process gas supplied from the showerhead 29 is turned into high-density plasma in the reaction chamber 17 to perform etching on the wafer W.

Operation of the component parts of the substrate processing apparatus 10 described above is controlled by a CPU of a controller, not shown, provided in the substrate processing apparatus 10 in accordance with a program for etching.

Figure 2:
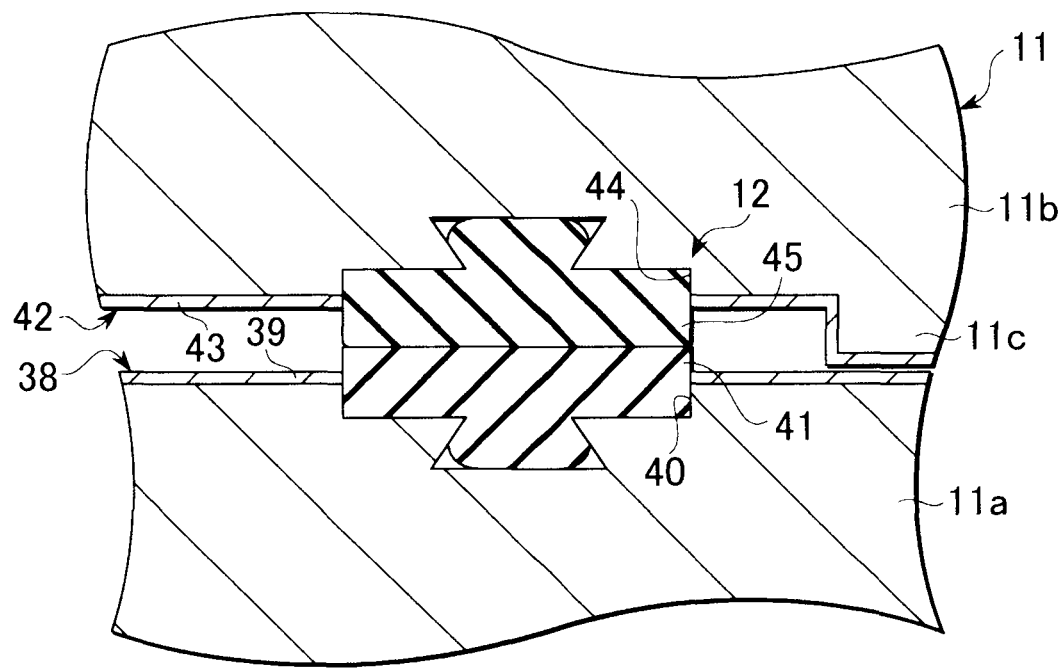
FIG. 2 is an enlarged cross-sectional view showing the seal mechanism in FIG. 1 and its vicinity.

FIG. 2 is an enlarged cross-sectional view showing the seal mechanism in FIG. 1 and its vicinity. The left side in FIG. 2 corresponds to the interior of the chamber 11, and the right side in FIG. 2 corresponds to the outside of the chamber 11. Thus, the left side in FIG. 2 will be referred to as "the inner side", and the right side in FIG. 2 will be referred to as "the outer side."

Referring to FIG. 2, an upper surface 38 of the side wall 11a, which is opposed to the upper lid 11b in the chamber 11 is covered with an alumite film 39 having a thickness of about 50 μm. The upper surface 38 of the side wall 11a is formed with a seal trench 40 from which aluminum is exposed by removing part of the alumite film 39 and the side wall 11a. A seal member 41 formed of O-ring-shaped fluorine rubber (specifically, vinylidene fluoride-based rubber (FKM)) or tetrafluoroethylene-perfluorovinyl ether-based rubber (FFKM)) is housed in the seal trench 40, and part of the seal member 41 projects from the upper surface 38 of the side wall 11a.

A lower surface 42 of the upper lid 11b of the chamber 11 opposed to the side wall 11a is covered with an alumite film 43 having a thickness of about 50 μm. The lower surface 42 of the upper lid 11b is formed with a seal trench 44 opposed to the seal trench 40, from which aluminum is exposed by removing part of the alumite film 43 and the upper lid 11b. A seal member 45 formed of O-ring-shaped fluorine rubber (FKM or FFKM) is housed in the seal trench 44, and part of the seal member 45 projects from the lower surface 42 of the upper lid 11b.

The seal trenches 40 and 44 and the seal members 41 and 45 constitute a seal mechanism 12 that seals the inner side from the outer side because the seal member 41 housed in the seal trench 40 and the seal member 45 housed in the seal trench 44 are brought into pressure contact with each other when the upper lide 11b is mounted on the side wall 11a.

The upper lid 11b is formed with a projecting portion 11c on an outer side of the lower surface 42, and the lower surface 42 of the projecting portion 11c abuts on the upper surface 38 of the side wall 11a. Thus, the degree of pressure contact in the seal mechanism 12, specifically, the amount of compression of the seal members 41 and 45 is limited.

Figure 3:
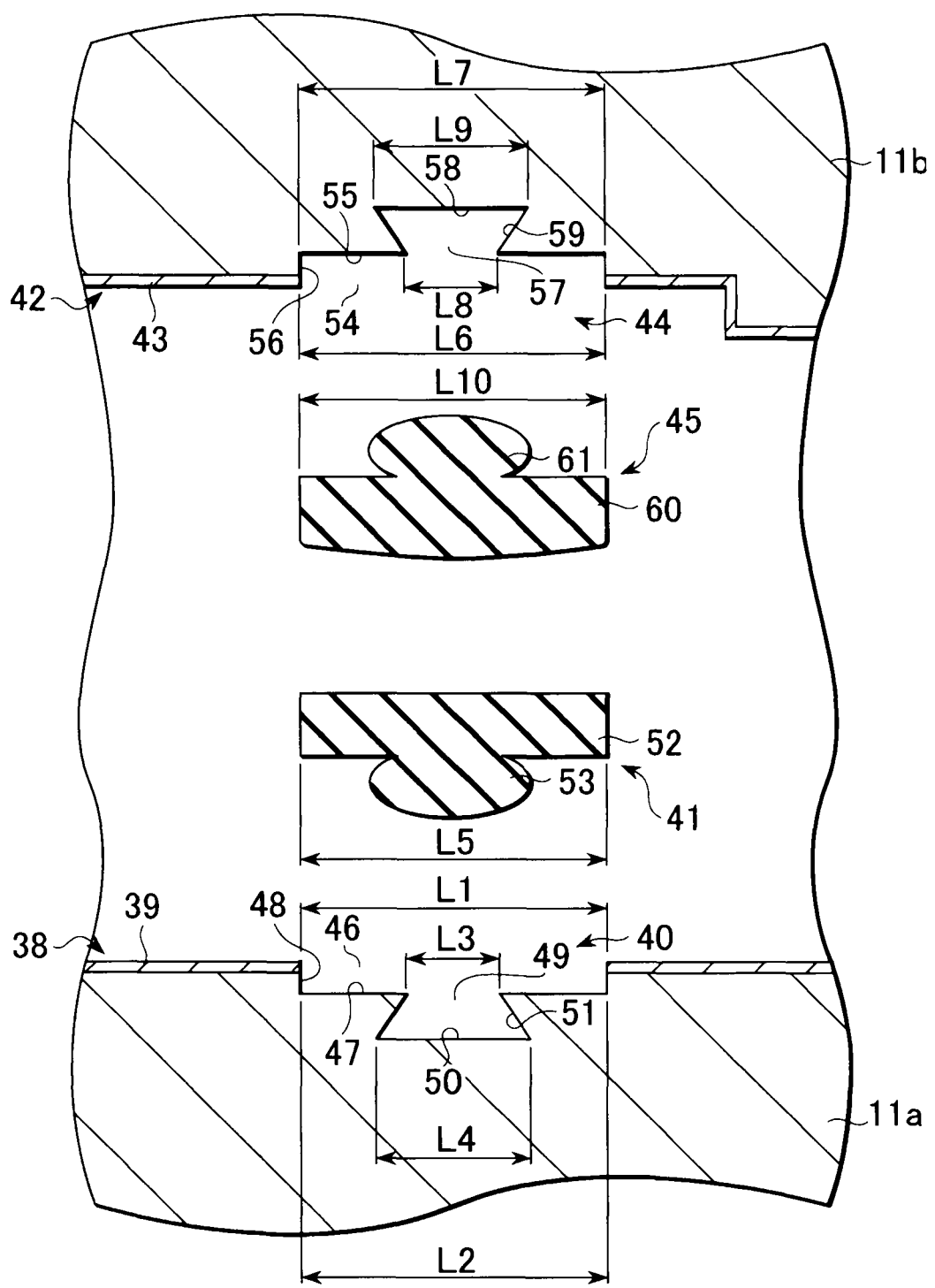
FIG. 3 is a cross-sectional view showing concrete shapes of component elements of the seal mechanism.

FIG. 3 is a cross-sectional view showing concrete shapes of component elements of the seal mechanism.

Referring to FIG. 3, the seal trench 40 has a housing trench 48 that opens in the upper surface 38 of the side wall 11a and in which a width L1 of an opening 46 is equal to a width L2 of a bottom portion 47, and a holding trench 51 that opens in the bottom portion 47 of the housing trench 48 and in which a width L3 of an opening 49 is smaller than a width L4 of a bottom portion 50. The bottom portion 50 of the holding trench 51 has aluminum exposed therefrom and functions as a seal surface as will be described later.

The seal member 41 has a covering portion 52 whose width L5 in the horizontal direction as viewed in the figure is substantially equal to the widths L1 and L2 of the opening 46 and the bottom portion 47 in the holding trench 48, and that is rectangular in cross section, and a projecting portion 53 that projects from a lower surface of the covering portion 52 and is substantially oval in cross section.

When the seal member 41 is housed in the seal trench 40, the projecting portion 53 of the seal member 41 enters the holding trench 51 of the seal trench 40. The projecting portion 53 that has entered the holding trench 51 is deformed in the holding trench 51 as shown in FIG. 2, and the seal member 41 is held in the seal trench 40 due to restoring force generated at the time of the deformation. This prevents the sealing member 41 from falling off. Moreover, when the seal member 41 is brought into pressure contact with the seal member 45, the projecting portion 53 of the seal member 41 is brought into pressure contact with the bottom portion 50 of the holding trench 51 due to reactive force, and the covering portion 52 of the seal member 41 is caused to abut on the bottom portion 47 of the housing trench 48. Because the bottom portion 47 is located between the bottom portion 50 and the upper surface 38 of the side wall 11a, the bottom portion 50 is shut off from the outside of the seal trench 40 when the covering portion 52 of the seal member 41 covers the bottom portion 47. Thus, the bottom portion 47 of the housing trench 48 functions as a shut-off surface.

The seal trench 44 has a housing trench 56 that opens in the lower surface 42 of the upper lid 11b and in which a width L6 of an opening 54 is equal to a width L7 of a bottom portion 55, and a holding trench 59 that opens in the bottom portion 55 of the housing trench 56 and in which a width L8 of an opening 57 is smaller than a width L9 of a bottom portion 59. The bottom portion 58 of the holding trench 59 has aluminum exposed therefrom and functions as a seal surface as will be described later.

The seal member 45 has a covering portion 60 whose width L10 in the horizontal direction as viewed n the figure is substantially equal to the widths L6 and L7 of the opening 54 and the bottom portion 55 in the holding trench 56, and that is rectangular in cross section, and a projecting portion 61 that projects from an upper surface of the covering portion 60 and is substantially oval in cross section. A lower surface of the covering portion 60 projects like a curved surface.

When the seal member 45 is housed in the seal trench 44, the projecting portion 61 of the seal member 45 enters the holding trench 59 of the seal trench 44. The projecting portion 61 that has entered the holding trench 61 is deformed in the holding trench 59 as shown in FIG. 2, and the seal member 45 is held in the seal trench 44 due to restoring force generated at the time of the deformation. This prevents the seal member 45 from falling off. Moreover, when the seal member 45 is brought into pressure contact with the seal member 41, the projecting portion 61 of the seal member 45 is brought into pressure contact with the bottom portion 58 of the holding trench 59 due to reactive force, and the covering portion 60 of the seal member 45 is brought into abutment on the bottom portion 55 of the housing trench 56. Because the bottom portion 55 is located between the bottom portion 58 and the lower surface 42 of the upper lid 11b, the bottom portion 58 is shut off from the outside of the seal trench 44 when the covering portion 60 of the seal member 45 covers the bottom portion 55. Thus, the bottom portion 55 of the housing trench 56 functions as a shut-off surface.

According to the present embodiment, the bottom portions 50 and 58 functioning as seal surfaces are shut off from the interior of the chamber 11 because the projecting portions 53 and 61 of the seal members 41 and 45 are brought into pressure contact with the bottom portions 50 and 58 of the seal trenches 40 and 44 from which aluminum is exposed, the covering portion 52 of the seal member 41 covers the bottom portion 47 of the housing trench 48 disposed between the bottom portion 50 of the housing trench 51 and the upper surface 38 of the side wall 11a, and the covering portion 60 of the seal member 45 covers the bottom portion 55 of the housing trench 56 disposed between the bottom portion 58 of the housing trench 59 and the lower surface 42 of the upper lid 11b. As a result, a process gas supplied into the chamber 11 and reaction product can be prevented from reaching the bottom portions 50 and 58 functioning as seal surfaces. Further, because the covering portions 52 and 60 of the seal members 41 and 45 cover the housing trenches 48 and 56, the surfaces of the seal trenches 40 and 44 having aluminum exposed therefrom are shut off from the alumite films 39 and 43 in the vicinity of the seal mechanism 12. As a result, even if the alumite films 39 and 43 with accumulated charges break (insulation breakdown), abnormal discharge (arcing) toward aluminum, which is caused by electric charges accumulated in the alumite, does not occur. Therefore, corrosion of the bottom portions 50 and 58 functioning as seal surfaces can be prevented, and abnormal discharge in the vicinity of the seal mechanism 12 can be prevented.

Moreover, according to the present embodiment, the seal members 41 and 45 are formed of fluorine rubber (FKM or FFKM). The fluorine rubber (FKM Or FFKM) is equal in dielectric strength to alumite, and has a greater thickness than an alumite film. Thus, the dielectric strength of the seal members 41 and 45 is higher than that of an alumite film, the surfaces of the seal trenches 40 and 44 can be satisfactorily protected.

Further, according to the present embodiment, the lower surface of the covering portion 60 of the seal member 45 is like a curved surface, a high contact pressure can be maintained by bringing the seal members 41 and 45 into partial contact with each other, and hence the sealing characteristics of the seal mechanism 12 can be improved.

Figure 4A:
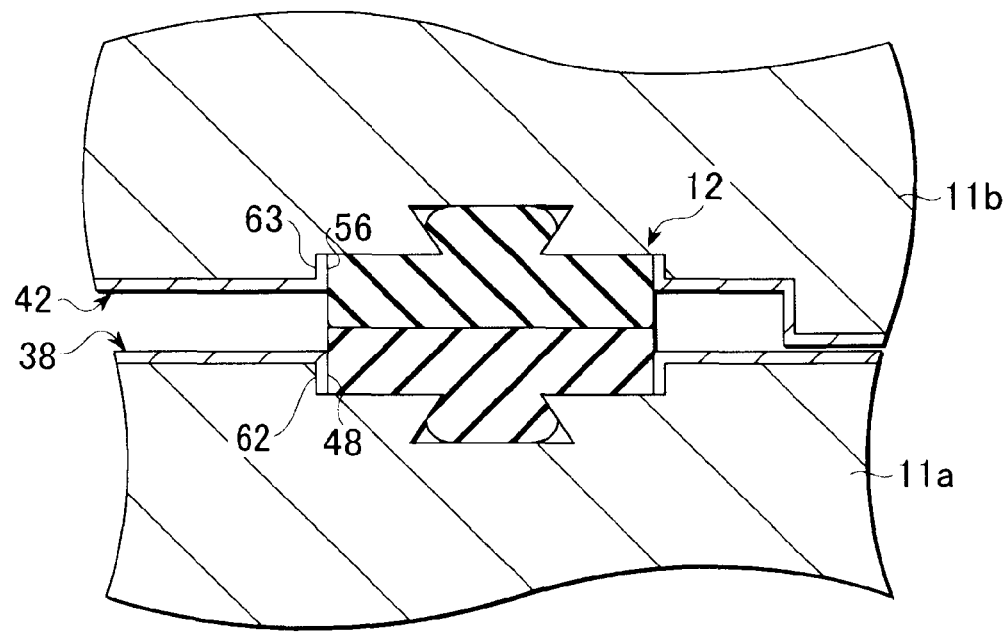

Further, as shown in FIG. 4A, the seal mechanism 12 may be constructed such that the side faces of the housing trenches 48 and 56 are covered with alumite films 62 and 63. This can reliably prevent corrosion of the side faces of the housing trenches 48 and 56 from which aluminum is exposed.

Figure 4B:
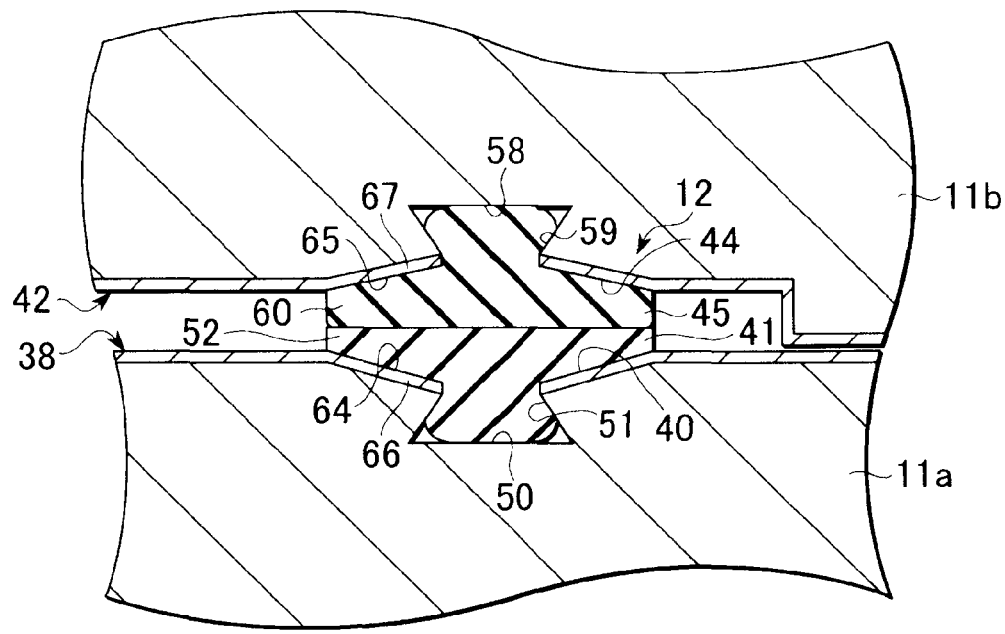

Further, although the seal mechanism 12 described above has the housing trenches 48 and 56, the seal mechanism 12 may have tapered surfaces 64 and 65 in place of the housing trenches 48 and 56 as shown in FIG. 4B. The tapered surfaces 64 and 65 are covered with alumite films 66 and 67. The tapered surface 64 is disposed between the upper surface 38 of the side wall 11a and the bottom portion 50 of the holding trench 51, and the tapered surface 65 is disposed between the lower surface 42 of the upper lid 11b and the bottom portion 58 of the holding trench 59. These tapered surfaces 64 and 65 has a function similar to the function of the above described bottom portions 47 and 55 functioning as shut-off surfaces. Moreover, the lower surface of the covering portion 52 of the seal member 41 has a tapered shape in accordance with the tapered surface 64, and similarly, the upper surface of the covering surface 60 of the seal member 45 has a tapered surface in accordance with the tapered surface 65. In this case, the seal trenches 40 and 44 can be formed with ease.

Further, although the seal mechanism 12 has the holding trench 51 in which the width L3 of the opening 49 is smaller than the width L4 of the bottom portion 50, and the holding trench 59 in which the width L8 of the opening 57 is smaller than the width L9 of the bottom portion 58, the seal mechanism 12 may have square trenches 68 and 69 in each of which the width of an opening is equal to the width of a bottom portion in place of the holding trenches 51 and 59. In this case as well, when the projecting portions 53 and 61 of the seal members 41 and 45 enter the square trenches 68 and 69, the projecting portions 53 and 61 are slightly deformed in the square trenches 68 and 69, and the seal members 41 and 45 are held by the square trenches 68 and 69 due to restoring force generated at that time. Because the square trenches 68 and 69 can be formed more easily than the holding trenches 51 and 59, hence the seal trenches 40 and 44 can be formed with ease.

Figure 5A:
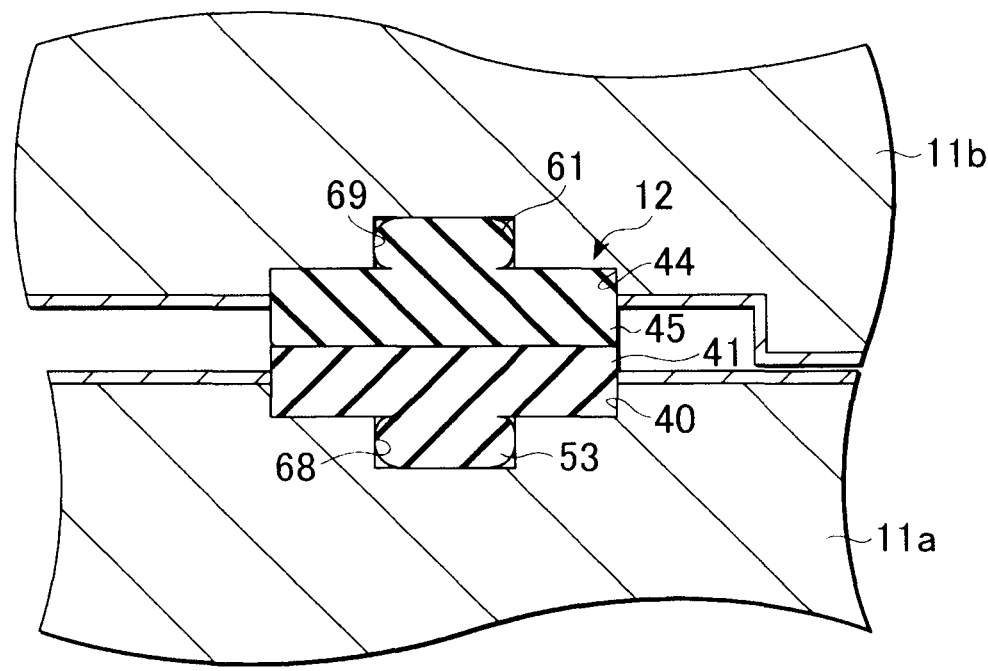
Figure 5B:
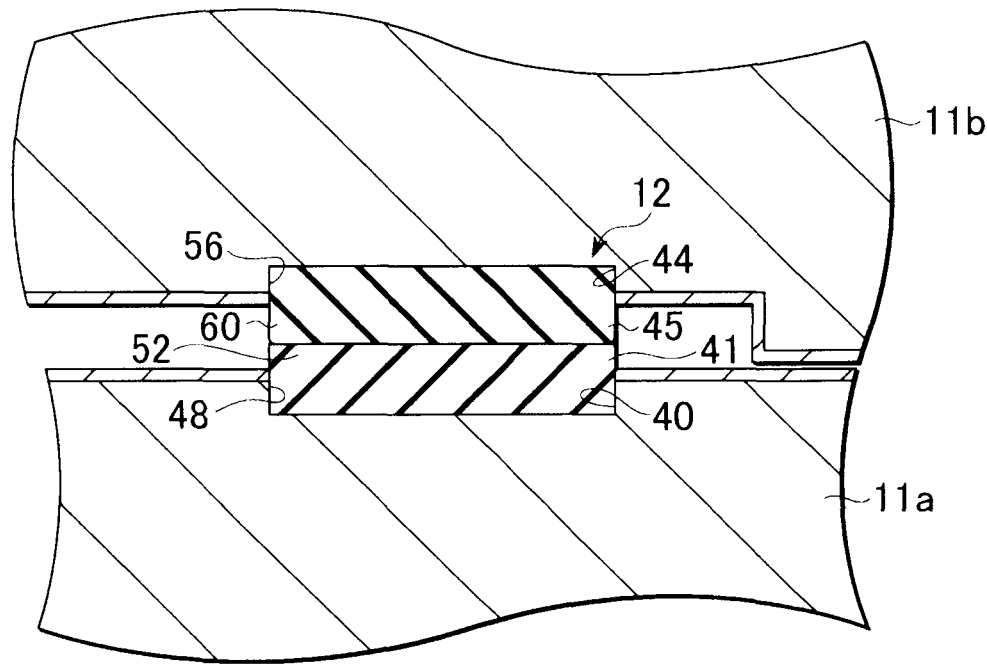

Further, although the above described sealing mechanism 12 has the holding trenches 51 and 59 and the square trenches 68 and 69, the seal trenches 40 and 44 may have only housing trenches 48 and 56 as shown in FIG. 5B if the seal members 41 and 45 do not have to be held in the seal trenches 40 and 44. Moreover, the seal members 41 and 45 have only the covered portions 52 and 60. In this case, the seal trenches 40 and 44 and the seal members 41 and 45 can be formed with ease.

Moreover, although in the present embodiment described above, the seal mechanism according to the present invention is disposed between the side wall of the chamber and the upper lid of the chamber, the location at which the seal mechanism according to the present invention may be disposed is not limited to this, but the seal mechanism according to the present invention may be disposed in a location that is heated so as to suppress attachment of deposit, such as an exhaust system.

Next, a description will be given of a seal mechanism according to a second embodiment of the present invention.

The seal mechanism according to the present embodiment differs from the first embodiment only in the location at which the seal mechanism is disposed in the substrate processing apparatus, and that there are provided only one seal trench and only one seal member. Features of the construction and operation that are the same as in the first embodiment will thus not be described, only features that are different from those of the first embodiment being described below.

Figure 6:
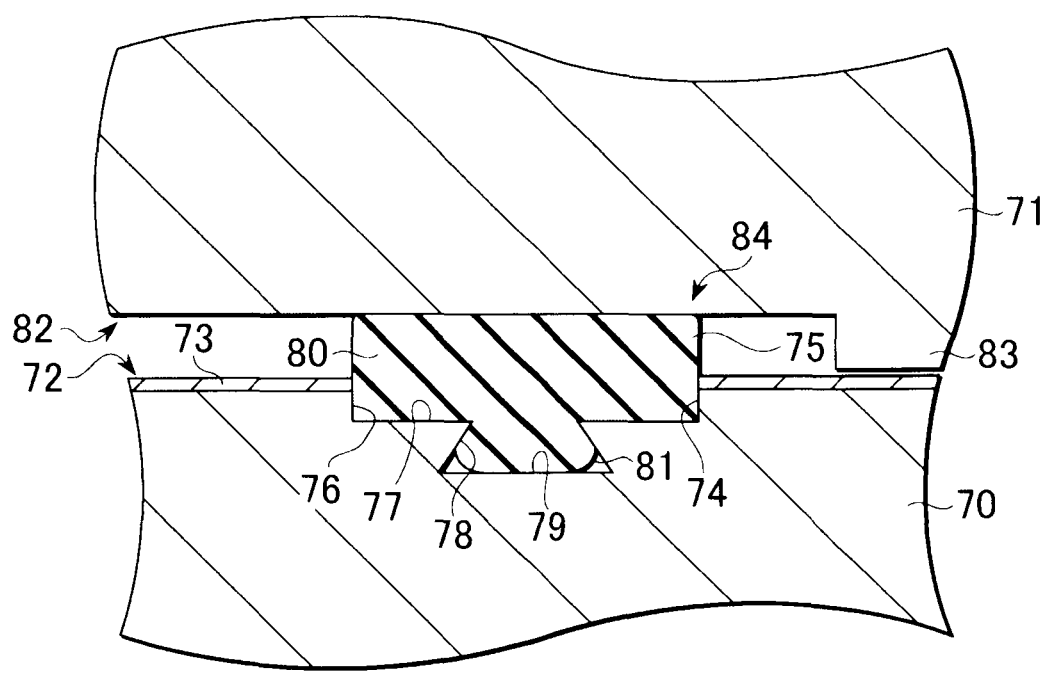
FIG. 6 is a cross-sectional view schematically showing the construction of a seal mechanism according to a second embodiment of the present invention.

FIG. 6 is a cross-sectional view schematically showing the construction of the seal mechanism according to the present embodiment. The left side in FIG. 6 corresponds to the interior of the chamber 11, and the right side in FIG. 6 corresponds to the outside of the chamber 11. Thus, the left side in FIG. 6 will be referred to as "the inner side", and the right side in FIG. 2 will be referred to as "the outer side."

Referring to FIG. 6, a structural member 70 is formed of aluminum, and an upper surface 72 of the structural member 70, which is opposed to the structural member 71 is covered with an alumite film 73. A seal trench 74 from which aluminum is exposed is formed in the upper surface 72 of the structural member 70. A seal member 75 formed of an O-ring shaped fluorine rubber (FKM or FFKM) is housed in the seal trench 74.

The seal trench 74 has a housing trench 76 that opens in the upper surface 72 of the structural member 70, and a holding trench 78 that opens in a bottom portion 77 of the housing trench 76. A bottom portion 79 of the holding trench 78 has aluminum exposed therefrom and functions as a seal surface as will be described later. The bottom portion 77 of the housing trench 76 functions as a shut-off surface as will be described later.

The seal member 75 has a covering portion 80 that is rectangular in cross section, and a projecting portion 81 that projects from a lower surface of the covering portion 80 and is substantially oval in cross section. An upper surface of the covering portion 80 projects like a curved surface.

A lower surface 82 of the structural member 71, which is opposed to the structural member 70 is made of a material with high heat resistance, high dielectric strength, and high corrosion resistance such as ceramic. The lower surface 82 functions as a seal surface as will be described later. The structural member 71 is formed with a projecting portion 83 on an outer side of the lower surface 82, and the lower surface 82 of the projecting portion 83 abuts on the upper surface 72 of the structural member 70.

Moreover, the seal trench 74, the seal member 75, and the lower surface 82 of the structural member 71 constitute a seal mechanism 84 that seals inner side from the outer side because the seal member 75 housed in the seal trench 74 and the lower surface 82 are brought into pressure contact with each other.

When the seal member 75 is brought into pressure contact with the lower surface 82 of the structural member 71, the projecting portion 81 of the seal member 75 is brought into pressure contact with the bottom portion 79 of the holding trench 78 due to reactive force, and the covering portion 80 of the seal member 75 is brought into pressure contact with the bottom portion 77 of the housing trench 76. Because the bottom portion 77 is located between the bottom portion 79 and the upper surface 72 of the structural member 70, the bottom portion 79 is shut off from the outside of the seal trench 74 when the covering portion 80 of the seal member 75 covers the bottom portion 77.

According to the present embodiment, the same effects as those obtained in the above described first embodiment can be obtained because the projecting portion 81 of the seal member 75 is brought into pressure contact with the bottom portion 79 of the seal trench 74 from which aluminum is exposed, The covering portion 80 of the seal member 75 is brought into pressure contact with the lower surface 82 of the structural member 71 made of ceramic, and the covering portion 80 of the seal member 75 covers the bottom portion 77 of the housing trench 76 disposed between the bottom portion 79 of the holding trench 78 and the upper surface 72 of the structural member 70.

Further, according to the present embodiment, because one seal trench, one seal member, and the seal surface made of ceramic constitute the seal mechanism, the construction of the seal mechanism can be simplified as compared with the above described first embodiment.

Although in the above described embodiments, the substrate processing apparatus is an etching processing apparatus as a semiconductor device manufacturing apparatus, the substrate processing apparatus to which the present invention may be applied is not limited to this, but may be other semiconductor devices manufacturing apparatuses using plasma, for example, a film formation processing apparatus using CVD (Chemical Vapor Deposition), PVD (Physical Vapor Deposition), or the like. Further, the present invention may be applied to substrate processing apparatuses such as an ion implantation processing apparatus, a vacuum transfer apparatus, a heat processing apparatus, an analyzing apparatus, an electron accelerator, an FPD (Flat Panel Display) manufacturing apparatus, a solar cell manufacturing apparatus, an etching processing apparatus as a physical quantity analyzing apparatus, and a film formation processing apparatus.

Further, the substrates in the above described embodiments are not limited to being semiconductor wafers, but rather may instead be any of various glass substrates used in LCDs (Liquid Crystal Displays), FPDs (Flat Panel Displays) or the like.

What is claimed is:

1. A seal mechanism that is disposed between first and second structural members having opposing surfaces, comprising:
    a first seal trench that is formed in a first opposing surface of the first structural member;
    a first seal member that is housed in said first seal trench, and part of which projects from the first opposing surface;
    a second seal trench that is formed in a second opposing surface of the second structural member; and
    a second seal member that is housed in said second seal trench, and part of which projects from the second opposing surface,
    wherein said first seal member and said second seal member are brought into pressure contact with each other,
    said first seal trench comprises a first seal surface from which aluminum is exposed and with which said first seal member is brought into pressure contact, and a first shut-off surface that is disposed between the
    first opposing surface and the first seal surface,
    said first seal member comprises a first covering portion that covers the first shut-off surface when said first seal member is housed in said first seal trench,
    said second seal trench comprises a second seal surface from which aluminum is exposed and with which said second seal member is brought into pressure contact, and a second shut-off surface that is disposed between the second opposing surface and the second seal surface, and said second seal member comprises a second covering portion that covers the second shut-off surface when said second seal member is housed in said second seal trench.

2. A seal mechanism as claimed in claim 1, wherein said first seal member and said second seal member are made of fluorine rubber.

3. A seal mechanism as claimed in claim 2, wherein the fluorine rubber is FKM or FFKM.

4. A seal mechanism as claimed in claim 1, wherein the first shut-off surface and the second shut-off surface comprise tapered surfaces.

5. A seal mechanism as claimed in claim 1, wherein said first seal trench comprises a first holding portion that holds said housed first seal member, and said second seal trench comprises a second holding portion that holds said housed second seal member.

6. A seal mechanism as claimed in claim 1, wherein a surface of said second seal member which is brought into pressure contact with said first seal member is shaped as a curved surface.

7. A substrate processing apparatus including a seal mechanism as claimed in claim 1.

* * * * *